United States Patent [19]

Schiebelhuth et al.

[11] 3,889,192

[45] June 10, 1975

[54] ARRANGEMENT FOR SUPPRESSING NOISE IN AN FM RECEIVER

[75] Inventors: Heinz Schiebelhuth, Frankfurt am Main; Herbert Bauer, Offenbach am Main, both of Germany

[73] Assignee: Braun AG, Frankfurt am Main, Germany

[22] Filed: Oct. 16, 1973

[21] Appl. No.: 406,781

[52] U.S. Cl. .................................. 325/348; 325/478

[51] Int. Cl. ............................................ H04b 1/10

[58] Field of Search ........... 325/348, 478, 456, 402, 325/403, 408, 480

[56] References Cited

UNITED STATES PATENTS

| | | | |
|---|---|---|---|
| 3,478,271 | 11/1969 | Ison | 325/348 |
| 3,538,253 | 11/1970 | Braun | 325/478 |
| 3,568,068 | 3/1971 | Russell, Jr. | 325/348 |
| 3,569,633 | 3/1971 | Brahman | 325/408 |
| 3,714,583 | 1/1973 | Craft | 325/348 |
| 3,783,387 | 1/1974 | Wernli | 325/348 |
| 3,810,023 | 5/1974 | Crowley et al. | 325/478 |

*Primary Examiner*—Charles E. Atkinson
*Attorney, Agent, or Firm*—Michael S. Striker

[57] ABSTRACT

An envelope demodulator connected to the intermediate frequency stage furnishes a signal having a DC component when the receiver is tuned to a station and an AC component resulting from amplitude modulation in the presence of noise. The low frequency stage of the receiver is enabled only when the field strength signal exceeds a predetermined value and the noise signal is less than a predetermined value.

8 Claims, 5 Drawing Figures

FIG. 1
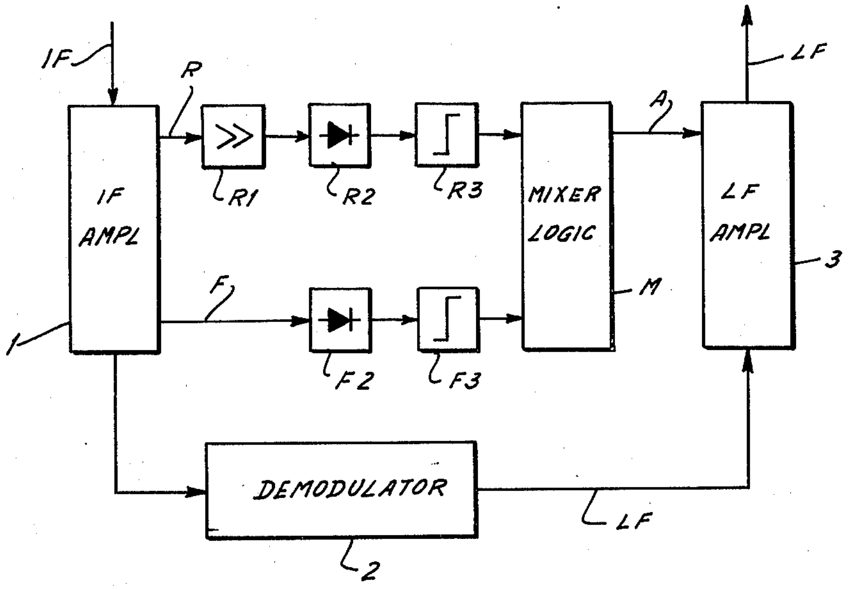
| F | R | A | LF |
|---|---|---|---|
| 0 | 0 | 1 | 0 |
| 0 | 1 | 1 | 0 |
| 1 | 1 | 1 | 0 |
| 1 | 0 | 0 | 1 |
FIG. 1a
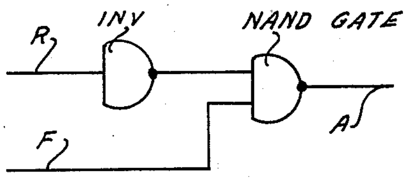
FIG. 1b

ARRANGEMENT FOR SUPPRESSING NOISE IN AN FM RECEIVER

BACKGROUND OF THE INVENTION

This invention relates to FM receivers and in particular to a circuit for suppressing noise in such FM receivers. The FM receivers of course contain a high frequency stage, at least one intermediate frequency stage, and a low frequency stage. Further, the low frequency stage has an associated switching circuit which enables the low frequency stage only under predetermined operating conditions.

FM receivers which have high amplification and strong limiting in the intermediate frequency stage unfortunately generate a high degree of noise in the absence of a station or when the leading or trailing edges of the station signals are crossed during tuning. Since the noise signals in these cases may often be a multiple of the usual low frequency signal level, very loud unpleasant noises can be generated by the receiver in the space between stations, in the absence of modulation, or when the above-mentioned edges of the station signal are crossed.

Various arrangements for combating this condition have been suggested. In a known arrangement, for example, the field strength is used as criterion and, specifically, the low frequency stage is only enabled when the field strength exceeds a predetermined threshold value. This type of circuit has the disadvantage that noise which is generated at the edges of the station during tuning cannot be removed since the field strength is sufficient for allowing the low frequency stage to be enabled, while the automatic volume control circuit causes the noise to be subjected to particularly high amplification.

In another conventional circuit, it has been attempted to overcome this difficulty by using two criteria, namely the field strength and the detuning of the ratio detector simultaneously. Specifically, the above-mentioned signals, namely the field strength signal and the signal corresponding to the detuning of the ratio detector are applied to a logic circuit in such a manner that the low frequency amplifier is only enabled if the field strength is sufficiently high and at the same time the voltage resulting from the detuning of the ratio detector is sufficiently small. The noise generated at the crossing of the station edges has therefore been substantially removed. However, this circuit is also not entirely satisfactory. For example with such an arrangement it is not possible to switch off the low frequency stage when two stations are very close together so that the frequency spectra overlap. In this case the voltage due to the detuning of the ratio detector becomes zero and thus both criteria namely no detuning voltage from the ratio detector and sufficient field strength are present. This difficulty arises often in modern receivers because the interval between stations has become very small while the sensitivity of the receivers has become high. Further, the region covered on the tuning scale for each individual station is decreased because the low frequency amplifier is already disabled before the particular edge has been reached. This causes greater difficulty in tuning of AFC receivers, since the AFC circuits can only be operative over a smaller scale portion.

SUMMARY OF THE INVENTION

The present invention resides in an FM receiver for receiving FM signals and having a high frequency stage, an intermediate frequency stage and a low frequency stage. It has means for furnishing a field strength signal connected to said intermediate frequency stage. It has noise measuring means for furnishing a noise signal corresponding to AM signals, if present, in said intermediate frequency stage, and switching circuit means connected to said noise measuring means and said means for measuring a field strength signal for furnishing an enabling signal for enabling said low frequency stage only in the presence of said field strength signal and the absence of said noise signal.

This arrangement shows the advantage that the slow frequency stage is enabled only in response to a signal directly indicative of the desired operating conditions, and not on the basis of signals which are indirectly indicative of such conditions, for example, the detuning voltage of the ratio detector mentioned above. The invention is of course based on the fact that any AM components in the intermediate frequency stage are caused by undesired noise.

In a first preferred embodiment of the present invention, the switching circuit means comprise a first threshold circuit which furnishes a signal only when the field strength signal exceeds a predetermined signal and a second threshold stage which furnishes a second threshold output signal only when said noise signal exceeds a predetermined noise signal. The switching circuit then further comprises an inverter connected to the output of said noise measuring means and a NAND-gate having a first input directly connected to the output of said first threshold circuit, a second input connected to the output of said inverter and an output for furnishing said enabling signal to said low frequency amplifier stage.

In a further embodiment of the present invention, note is taken of the fact that the intermediate frequency stage usually limits the field strength signal to a predetermined field strength signal which can be used as a reference value and the noise signal can then be subtracted therefrom. In this particular embodiment, the switching circuit means comprise a subtraction circuit which subtract the noise signal, after rectification and voltage doubling, from the field strength signal which has also been rectified and voltage doubled. The resulting subtraction output signal is then applied to a threshold circuit which furnishes the enabling signal only when the subtraction output signal exceeds a predetermined value. This predetermined value is just under the limiting field strength value which exists in the intermediate frequency stage.

In a particularly preferred embodiment of the present invention the subtraction circuit is a series circuit comprising a first resistor which is connected in parallel with the voltage doubling circuit associated with the field strength signal and a second resistor connected in parallel with the voltage doubling circuit associated with the noise measuring means. The series connection is such that the voltage drop across one of the resistors opposes that across the other. The subtraction output signal is then available at the free terminals of the two resistors.

Instead of separate circuits for deriving the field strength signal and the noise signal, a single circuit can be furnished. Thus in a third embodiment of the present invention an envelope demodulator circuit is connected to the IF stage. The output of the envelope demodulator circuit is subjected to DC amplification. At the output of the DC amplifier the signal is divided into a DC component corresponding to the field strength signal and, by use of a decoupling capacitor, an AC signal which corresponds to the noise signal. The subtraction circuit comprising two series connected resistors which was described above can again be used in conjunction with a threshold stage which, as explained previously, furnishes the signal enabling the low frequency stage only when the subtraction output signal is substantially equal to the field strength signal.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a block diagram showing a first embodiment of the present invention;

Figure 2:
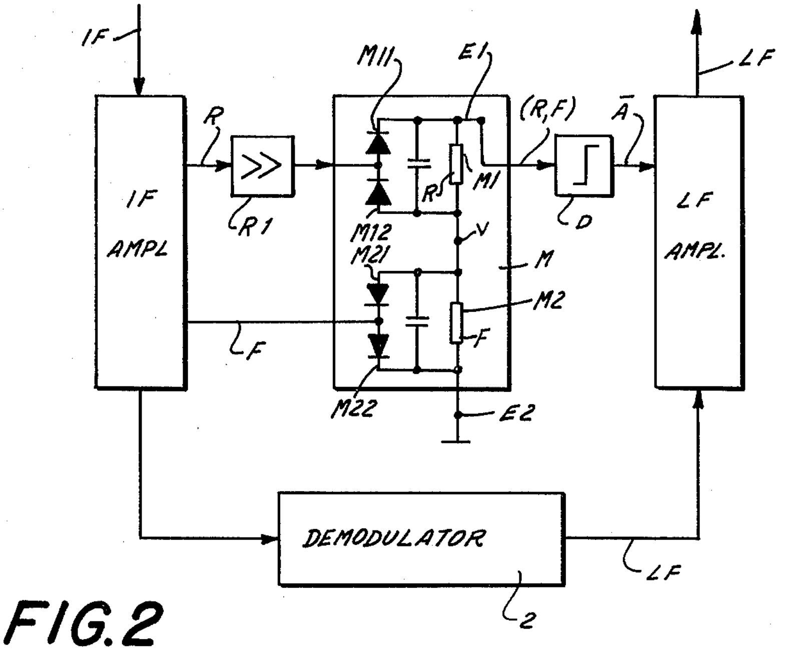
Figure 3:
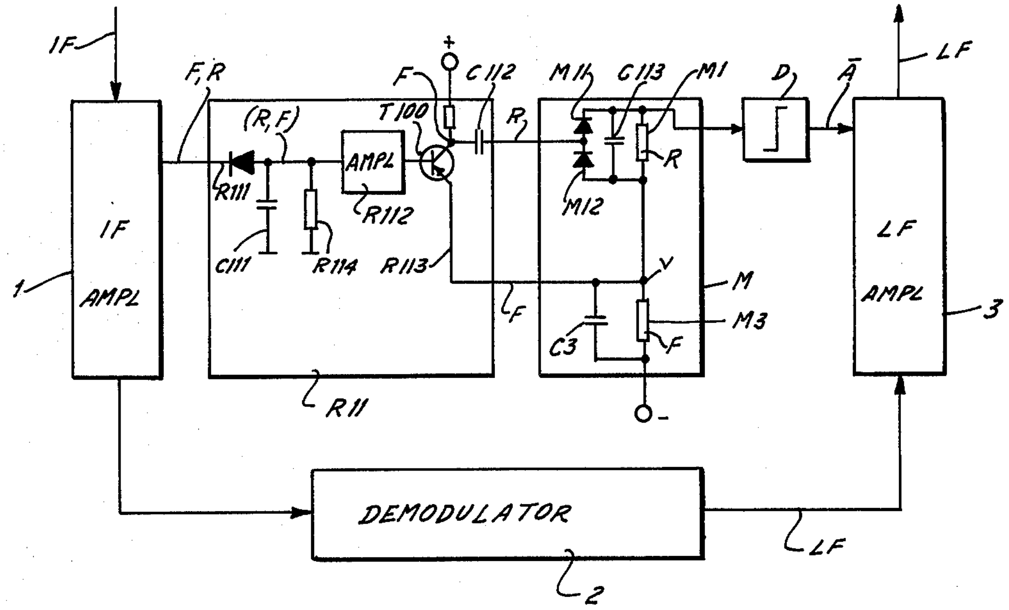

FIG. **1*a* is a truth table for the switching circuit of FIG. 1**;

FIG. **1*b* is the logic circuitry corresponding to the truth table in FIG. 1a; and FIGS. 2 and 3** show alternate embodiments of the present invention.

DESCRIPTION OF THE PREFERRED EMBODIMENTS:

A preferred embodiment of the present invention will now be described with reference to the drawing.

In FIG. 1, reference numeral 1 refers to an intermediate frequency amplifier herein referred to as an intermediate frequency stage whose output is connected through a demodulator 2 to a low frequency amplifier stage, herein referred to as a low frequency stage 3. A noise signal R and a field strength signal F are derived from intermediate frequency stage 1. The noise signal R is amplified by an amplifier having an AM pass characteristic, labelled R1 in the Figure, and the resultant signal is rectified in a rectifier R2 and applied to a threshold stage labelled R3 which is herein referred to as the second threshold stage furnishing the second threshold output signal and is part of the switching means.

The field strength signal F, also after rectification in a rectifier F2 is applied to the input of a threshold stage labelled F3, herein referred to as a first threshold stage. The first threshold stage furnishes a first threshold output signal only when the field strength signal F exceeds the threshold associated with stage F3. Threshold stage F3 is also part of the switching means. The outputs of the first and second threshold stages, F3 and R3 respectively, are applied to the inputs of a mixing stage M which is also part of the switching means. A preferred embodiment of that stage is shown in detail in FIG. **1*b*. The signal at the output of mixer stage M, labelled A in the Figure is the enabling signal which blocks or enables low frequency amplifier 3 in accordance with the conditions at the input of the mixer stage M. Specifically, the absence of a signal A enables low frequency amplifier 3** in a preferred embodiment of the present invention, while the presence of a signal serves to block said amplifier. When this type of logic is used, the truth table shown in FIG. 1a applies. Thus it is seen that whenever the signal A is a "1" the low frequency amplifier is disabled, while a "0" results in enabling of the low frequency amplifier. As stated previously it is desired to enable the low frequency amplifier in the presence of a field strength and the absence of a noise signal. Thus it is shown that the truth table in FIG. 1a has a 0 for A and a 1 for enabling the low frequency amplifier only in the presence (1) of the field strength signal (F) and the absence (0) of a noise signal (R).

The corresponding logic circuit is shown in FIG. **1*b*. It is seen that the noise signal is applied to an inverter whose output forms one input of a NAND-gate. The other input of the NAND-gate is the field strength signal F, preferably after rectification in rectifier F2. The output of the NAND-gate shown in FIG. 1b is the signal shown by A in FIG. 1**.

FIG. 2 shows an alternate embodiment of the present invention. In this embodiment it is assumed that a very high degree of amplification exists in intermediate frequency amplifier 1 and, further, that this amplifier is strongly limiting. When the signal F is applied to a voltage doubler circuit comprising rectifiers M21 and M22 as well as a capacitor in parallel with these rectifiers, the output across a resistor M2 connected in parallel with the voltage doubler circuit is a DC voltage which is proportional to the field strength signal, but whose magnitude has an upper limit corresponding to the limiting action of stage 1. The above-mentioned limiting value can then be used as a measure of the smallest amount of field strength which it needs to be present at the input of the receiver for proper reception. This voltage can thus be used as a reference voltage. The voltage proportional to noise, that is the noise signal, is then subtracted from this reference voltage. This is accomplished by subjecting the signal R to voltage doubling in rectifiers M11 and M12 across which a capacitor is also connected. The voltage across a resistor M1 connected in parallel with the voltage doubler circuit then constitutes a measure of the noise signal. Resistors M2 and M1 are connected in series in such a manner that the voltage drop across resistor M1 is of opposite polarity to that across resistor M2. The DC signal, labelled (R,F) in FIG. 2 which corresponds to the difference between the field strength signal and the noise signal is then applied to a threshold stage labelled D in the Figure. The threshold value of this threshold stage is set to be just slightly under the above-mentioned reference voltage. A signal will thus appear at the output of threshold stage D when the field strength signal is sufficiently large and the noise signal sufficiently small. This signal is a signal which can be used directly to enable low frequency amplifier 3, that is it is the inverse of the signal A of FIG. 1.

FIG. 3 shows a particularly preferred embodiment of the present invention. A signal which contains both the field strength and the noise signal is tapped from IF amplifier 1 and subjected to envelope demodulation by means of a rectifier $R_{111}$ which is connected in series with a capacitor $C_{111}$. Further, a resistor $R_{114}$ is connected in parallel with capacitor C11. At the common point of rectifier $R_{111}$ and the parallel combination of $C_{111}$ and $R_{114}$ there is created a signal having a DC component corresponding to the field strength signal and an AC component corresponding to the noise signal. A DC amplifier $R_{112}$ is used to amplify this signal. The output stage of amplifier $R_{112}$ comprises a transistor $T_{100}$ into whose emitter circuit is connected the parallel combination of a resistor M3 and a capacitor C3. One terminal of this parallel combination is connected to the emitter, while the other terminal is connected to ground potential. The voltage across resistor M3 thus constitutes a measure of the field strength. Connected to the collector of transistor $T_{100}$ is a capacitor $C_{112}$. This capacitor serves to block the DC component, that is the field strength component from the signal at collector T of transistor $T_{100}$. The so separated AC signal, which is the noise signal, is again subjected to voltage doubling, that is the free terminal of capacitor $C_{112}$ is connected to the anode of a diode M11 and the cathode of a diode M12, a capacitor $C_{113}$ being connected from the cathode of diode M11 to the anode of diode M12. As was the case in FIG. 2, a resistor M1 is connected in parallel with capacitor $C_{113}$. The signal across resistor M1 then constitutes the noise signal. Again, resistors M3 and M1 are connected in series in such a way that the polarity of voltage across resistor M1 is opposite to that across resistor M3. The voltage at the free end of resistor M1 thus constitutes a measure of the difference between the field strength signal and the noise signal. This signal is applied to the input of a threshold stage D which is identical to the threshold stage D of FIG. 2 and will therefore not be further discussed here.

It is seen that in the embodiment of FIG. 3 the field strength and noise signals are derived in a particularly simple fashion from IF amplifier 1.

While the invention has been illustrated and described as embodied in specific circuits for deriving the noise and field strength signals and for combining these signals to derive the enabling signal for the low frequency amplifier, it is not intended to be limited to the details shown, since various circuit and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. In an FM receiver having an intermediate frequency stage and a low frequency stage, a noise suppression arrangement, comprising, in combination, first circuit means connected to said intermediate frequency stage for furnishing a field strength signal; noise measuring means connected to said intermediate frequency stage for furnishing a noise signal corresponding to AM signals, if present, in said intermediate frequency stage; and switching means connected to said first circuit means and said noise measuring means, for furnishing an enabling signal for enabling said low frequency stage only in the simultaneous presence of said field strength signal and absence of said noise signal.

2. An arrangement as set forth in claim 1, wherein said first circuit means comprise first threshold means for furnishing a first threshold output signal only when said field strength signal exceeds a first reference signal; wherein said noise measuring means comprise a second threshold stage for furnishing a second threshold output signal only when said noise signal exceeds a second reference signal; and wherein said switching circuit means comprise an inverter connected to said second threshold stage for furnishing an inverted second threshold output signal and a NAND-gate having a first input connected to the output of said first threshold stage, a second input connected to the output of said inverter and a NAND-gate output for furnishing said enabling signal.

3. An arrangement as set forth in claim 1, wherein said intermediate frequency stage limits said field strength signal to a predetermined maximum field strength signal; wherein said switching circuit means comprise a subtraction circuit for subtracting said noise signal from said field strength signal and furnishing a subtraction output signal as a function of the difference therebetween; and threshold circuit means having a threshold corresponding to a reference value slightly less than said predetermined maximum field strength signal, for furnishing said enabling signal when said subtraction output signal is equal to said reference value.

4. An arrangement as set forth in claim 1, wherein said means for furnishing a field strength signal comprise an envelope demodulator circuit connected to said intermediate frequency stage, and a DC amplifier connected to the output of said envelope demodulator circuit, said DC amplifier having an output resistor for furnishing said field strength signal; and wherein said noise measuring means comprise a capacitor connected to the output of said DC amplifier circuit for furnishing an AC signal, said AC signal constituting said noise signal.

5. In an FM receiver having an intermediate frequency stage and a low frequency stage, a noise suppression arrangement, comprising, in combination, first circuit means connected to said intermediate frequency stage for furnishing a field strength signal, said first circuit means comprising first threshold means for furnishing a first threshold output signal only when said field strength signal exceeds a first reference signal; noise measuring means connected to said intermediate frequency stage for furnishing a noise signal corresponding to AM signals, if present, in said intermediate frequency stage, said noise measuring means comprising a second threshold stage for furnishing a second threshold output signal only when said noise signal exceeds a second reference signal; and switching means connected to said first circuit means and said noise measuring means for furnishing an enabling signal for enabling said low frequency stage only in the simultaneous presence of said field-strength signal and absence of said noise signal, said switching circuit means comprising an inverter connected to said second threshold stage for furnishing an inverted second threshold output signal, and a NAND-gate having a first input connected to the output of said first threshold stage, a second input connected to the output of said inverter and a NAND-gate output for furnishing said enabling signal.

6. In an FM receiver having an intermediate frequency stage and a low frequency stage, a noise suppression arrangement, comprising, in combination, first circuit means connected to said intermediate frequency stage for furnishing a field strength signal, said intermediate frequency stage limiting said field strength signal to a predetermined maximum field strength signal;

noise measuring means connected to said intermediate frequency stage for furnishing a noise signal corresponding to AM signals, if present in said intermediate frequency stage; and switching means connected to said first circuit means and said noise measuring means, for furnishing an enabling signal for enabling said low frequency stage only in the simultaneous presence of said field strength signal and absence of said noise signal, said switching means comprising a subtraction circuit for subtracting said noise signal from said field strength signal and furnishing a subtraction output signal as the function of the difference therebetween, and threshold circuit means having a threshold corresponding to a reference value slightly less than said predetermined maximum field strength signal, for furnishing said enabling signal when said subtraction output signal is equal to said reference value.

7. An arrangement as set forth in claim 6, wherein said means for furnishing a field strength signal comprise a first voltage doubler circuit having a first resistor connected in parallel therewith; wherein said noise measuring means comprise a second voltage doubler circuit having a second resistor connected in parallel therewith; and wherein said subtraction circuit means comprise means for connecting said first and second resistors in series in such a manner that the voltage across the series connected resistors is equal to said subtraction output signal.

8. In an FM receiver having an intermediate frequency stage and a low frequency stage, a noise suppression arrangement, comprising, in combination, first circuit means connected to said intermediate frequency stage for furnishing a field strength signal, said first circuit means comprising an envelope demodulator circuit connected to said intermediate frequency stage, and a DC amplifier connected to the output of said envelope demodulator circuit, said DC amplifier having an output resistor for furnishing said field strength signal; noise measuring means connected to said intermediate frequency stage for furnishing a noise signal corresponding to AM signals, if present, in said intermediate frequency stage, said noise measuring means comprising a capacitor connected to the output of said DC amplifier circuit for furnishing an AC signal constituting said noise signal; and switching means connected to said first circuit means and said noise measuring means, for furnishing an enabling signal for enabling said low frequency stage only in the simultaneous presence of said field strength signal and absence of said noise signal.

* * * * *